United States Patent [19]
Arai

[11] Patent Number: 5,798,646
[45] Date of Patent: Aug. 25, 1998

[54] APPARATUS FOR MEASURING REMAINING CAPACITY OF A BATTERY

[75] Inventor: Youichi Arai, Susono, Japan

[73] Assignee: Yazaki Corporation, Tokyo, Japan

[21] Appl. No.: 704,868

[22] Filed: Aug. 30, 1996

[30] Foreign Application Priority Data

Sep. 1, 1995 [JP] Japan .................. 7-225454

[51] Int. Cl.⁶ .................................. G01N 27/416
[52] U.S. Cl. .................. 324/427; 324/431; 340/636; 320/48; 364/481
[58] Field of Search .................. 324/426, 427, 324/428, 429, 431, 433, 771; 320/44, 48; 364/550, 551.01, 481; 340/636

[56] References Cited

U.S. PATENT DOCUMENTS

| | | | |
|---|---|---|---|
| 4,390,841 | 6/1983 | Martin et al. | 324/427 |
| 4,849,700 | 7/1989 | Morioka et al. | 324/427 |
| 5,287,286 | 2/1994 | Ninomiya | 364/481 |
| 5,404,106 | 4/1995 | Matsuda | 324/427 X |
| 5,473,262 | 12/1995 | Ysoshimatsu | 324/771 |
| 5,479,085 | 12/1995 | Honda et al. | 320/48 |
| 5,592,094 | 1/1997 | Ichikawa | 324/427 |
| 5,617,324 | 4/1997 | Arai | 324/427 X |

*Primary Examiner*—Diep N. Do
*Attorney, Agent, or Firm*—Oblon, Spivak, McClelland, Maier & Neustadt, P.C.

[57] ABSTRACT

A battery remaining capacity measuring apparatus including a remaining capacity operation portion 3 for collecting a voltage of a battery 3 and a current passing through a load until an accelerator is on when turning an accelerator on and once turning an accelerator off after starting an ignition, obtaining a line from 2 points having a strongest relationship between the voltage and the current, and displaying an initial remaining capacity according to this line and a reference value.

2 Claims, 7 Drawing Sheets

DETECTION OF A REMAINING CAPACITY IN THE STATE
OF A FIRST ACCELERATOR-ON AFTER IGON
(VOLTAGE WAVEFORM)

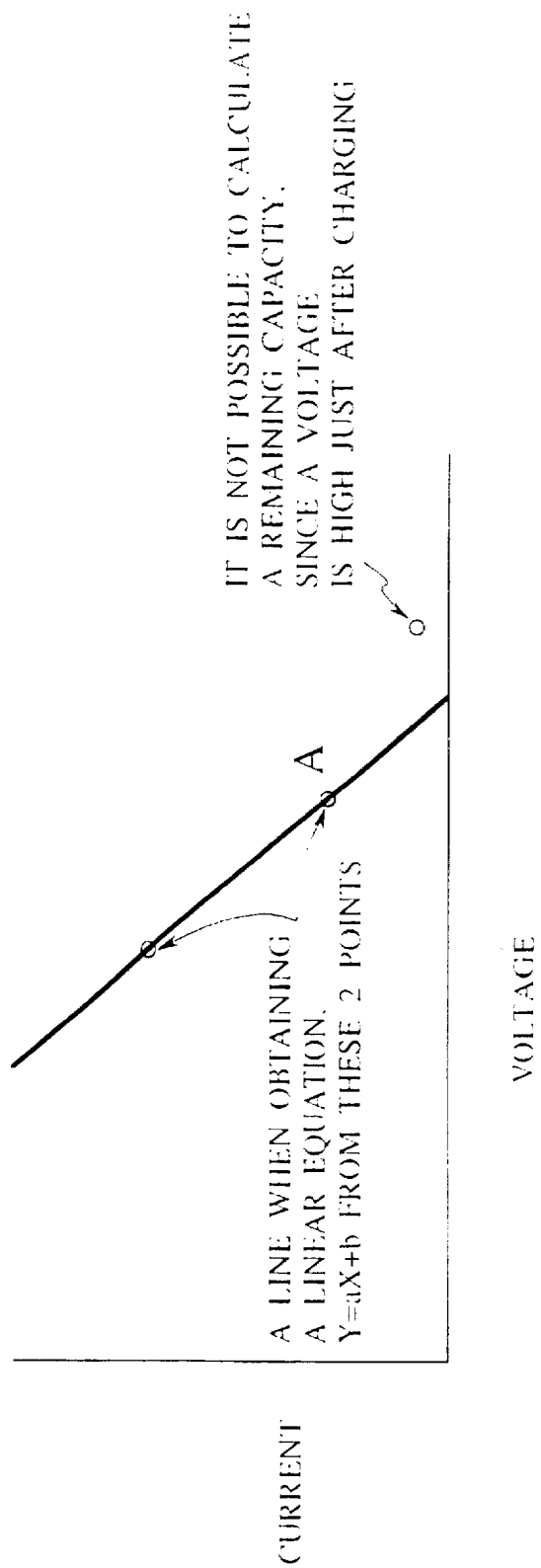

APPARATUS FOR MEASURING REMAINING CAPACITY OF A BATTERY

BACKGROUND OF THE INVENTION

1. Field of the invention

The invention relates to a measuring apparatus which displays an initial remaining capacity of a battery together with starting of a load.

2. Description of the Related Art

For example, it is preferably considered that a remaining capacity of an electric battery is calculated by assuming that it reduces approximately in a straight line. Thereby, an open circuit voltage of a battery (a state of disconnecting a load from a battery) is measured in order to obtain a remaining capacity.

Therefore, an open circuit voltage is measured after a predetermined time just after ignition on. Then, according to the open circuit voltage, an approximate linear function is found by a method of least squares so that a remaining capacity voltage can be obtained.

Furthermore, sometimes, an electric car starts continuously running immediately after stopping charging, while charging, or during completion of charging.

In this case, in a system for obtaining an approximate line by a method of least squares so that a remaining capacity voltage can be displayed, it may not be possible to obtain a correct initial remaining capacity just after ignition on, since an intense change of a current and voltage would provide a line having a relationship between a current and a voltage which is only approximate. Accordingly, by turning an accelerator on and then once turning the accelerator off, an ignition on has measured an open circuit voltage in order to display this voltage as an initial remaining capacity.

However, in case of continuous running soon after stopping a charge or in case of continuous running after completing a charge, shown in FIG. 1, the terminal voltage of a battery just after the battery is charged is higher than the normal open circuit voltage of the battery, since the battery has been charged by forcibly using higher voltage.

Thus, if a terminal voltage of a battery which just has been charged is considered as an open circuit voltage for obtaining a remaining capacity, the problem is that the remaining capacity voltage is incorrect.

For example, assume that as soon as an electric car starts continuously running, an approximate line is obtained by a method of least squares so that a remaining capacity voltage can be displayed. In this case, it is not possible to obtain a correct remaining capacity, since an intense change of a current and voltage provides a line having a relationship between a current and a voltage which is only approximate.

In general, as shown in FIG. 7, when time in the range from a few minutes to 10 minutes passes from a start of continuously running, a current is more accurately related with a voltage.

That is, in case of obtaining an initial remaining capacity by using an approximate line, although it is possible to display a correct remaining capacity, it requires a delay ranging from a few minutes to 10 minutes to display it.

SUMMARY OF THE INVENTION

It is an object of the present invention to provide an apparatus for measuring remaining capacity of a battery which enables display of correct remaining capacity voltage quickly.

According to a first aspect of the invention, all battery remaining capacity measuring apparatus (i.e., an apparatus for measuring remaining capacity of a battery) for measuring an open circuit voltage of the battery before a load starts running continuously and for displaying an initial remaining capacity according to the measured open circuit voltage in order to obtaining an initial remaining capacity, comprises a remaining capacity operation portion for collecting a voltage of the battery and a current passing through the load until the load starts running continuously according to a start of the load, for obtaining a line which shows a change of a voltage and a current from a plurality of points corresponding to the voltages and currents, and for displaying an initial remaining capacity which is obtained according to the line and a reference current value. Accordingly, it is possible to display a correct remaining capacity before a load starts running continuously.

More particularly, in case of running just after charging, an electric car turns an accelerator on and immediately once turns it off, thereby leaving the battery not connected to a load. Then an initial remaining capacity is obtained. Therefore, according to the present invention, even if an electric car starts continuously running just after charging, it is possible to display a correct initial remaining capacity immediately.

According to a second aspect of the invention, in a battery remaining capacity measuring apparatus, the remaining capacity operation portion comprises an initial remaining capacity calculation means for collecting the voltage and the current before the load starts running continuously, for obtaining a line which shows a characteristic of change of the points when the points are decided, and for finding an intersecting point which the reference current value crosses at the line so that the initial remaining capacity voltage can be displayed; and an extract point selection means for selecting a plurality of points so that a voltage can have a relationship with a current within the range from a point near just where a voltage decreases sharply to a point near a minimum voltage where the voltage decreases sharply. Accordingly, it is possible to obtain a correct remaining capacity voltage if a load hardly changes.

According to a third aspect of the invention, in a battery remaining capacity measuring apparatus, the remaining capacity operation portion comprises an approximate line calculation means for sampling a plurality of voltage of the battery and a current passing through a load for every predetermined time when the load starts, for discriminating a relationship between the voltage and the current, for deciding a start of the load if having more relationship, and then for obtaining an approximate line according to the sampled voltage and current; and a remaining capacity calculation means for displaying a remaining capacity voltage of the battery which is obtained according to the approximate line and a reference value. Accordingly, it is possible to display a remaining capacity voltage which is obtained by a method of least squares as usual.

BRIEF DESCRIPTION OF THE DRAWINGS

FIG. 5 is a waveform graph showing voltage data in the state of accelerator on.

FIG. 6 is a waveform graph showing current data in the state of accelerator on.

FIG. 7 is a diagram showing a line obtained by extracting 2 points according to the invention.

DETAILED DESCRIPTION OF THE PREFERRED EMBODIMENTS

An embodiment of the present invention will be described hereinafter with reference to the accompanying drawings.

Figure 1:
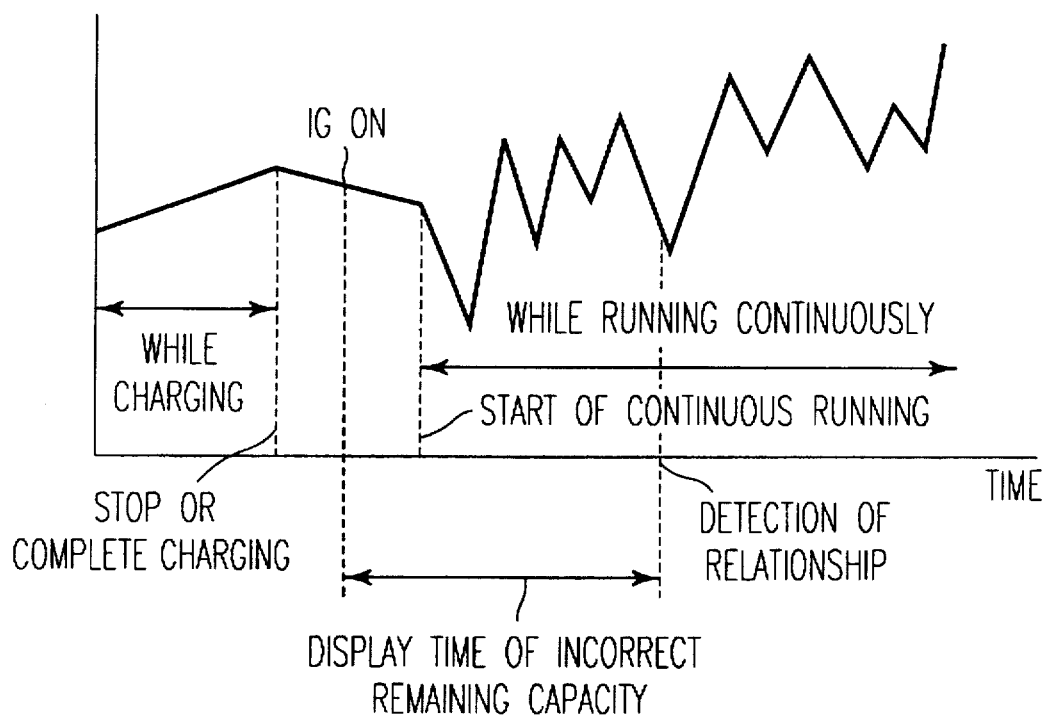
FIG. 1 is a diagram showing the problems of a conventional system.
Figure 2:
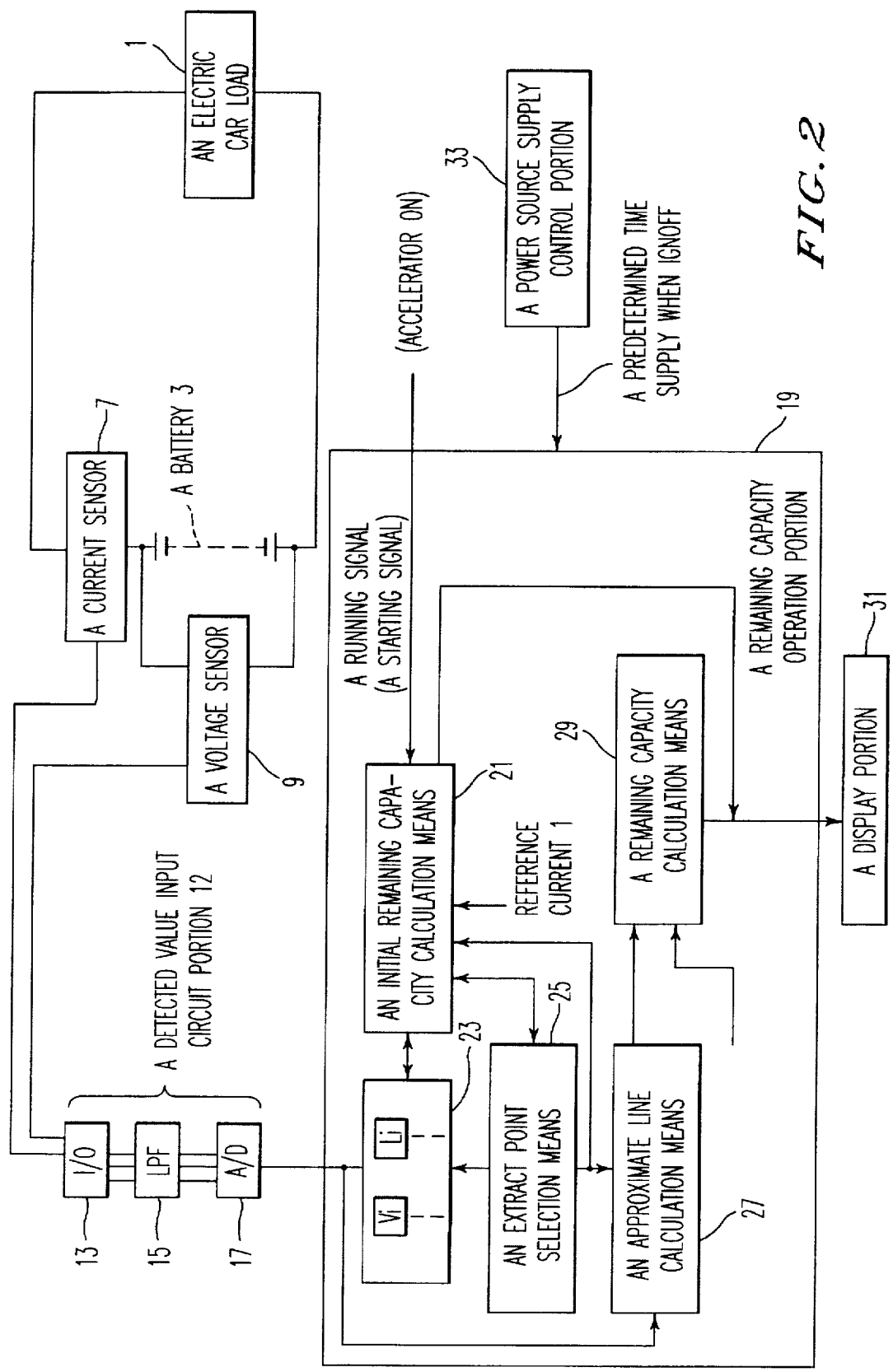
FIG. 2 is a diagram showing a schematic configuration of a battery remaining capacity measuring apparatus according to the invention.
Figure 3:
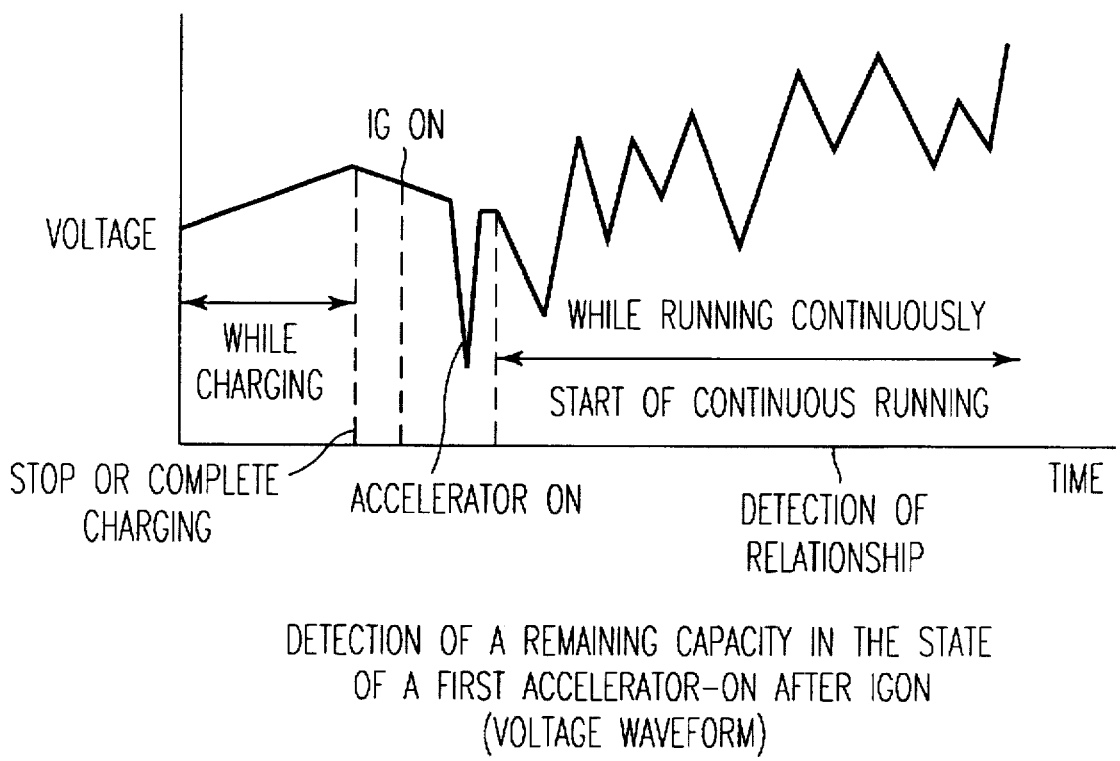
FIG. 3 is a timing graph for detecting a voltage when calculating an initial remaining capacity.

FIG. 2 shows a schematic diagram of all battery remaining capacity measuring apparatus (i.e., an apparatus for measuring remaining capacity of a battery) according to the invention. As shown in FIG. 3, a voltage and a current do not change sharply during the period from ignition on to accelerator on. A point at which a voltage declines gently and then goes down sharply is observed. Thereby, an initial remaining capacity is calculated.

In FIG. 2, a numeral 1 denotes an electric car load (for example, a motor) connected to a battery 3. A numeral 7 denotes a current sensor for detecting a current which passes through in an electric car load (as refereed to a load below). A numeral 9 denotes a voltage sensor which detects a terminal voltage of a battery 3.

A numeral 12 denotes a detected value input circuit portion. A detected value input circuit portion 12 comprises I/O port 13, low-pass filter (LPF) 15 and A/D converter 17, where a discharge current and a terminal voltage of a battery 3 are inputted from a voltage sensor 9 and a current sensor 7 in order to detect the voltage and the current, noise is eliminated and the voltage and the current are converted to digital form.

A numeral 19 denotes a remaining capacity operation portion. A configuration of a remaining capacity operation portion 19 comprises an initial remaining capacity calculation means 21, an extract point selection means 25, an approximate line calculation means 27 and a remaining capacity calculation means 29. Furthermore, a remaining capacity operation portion 19 is connected to a display portion 31 and a power source supply control portion 33.

When a power source is provided together with an ignition on, the initial remaining capacity calculation means 21 takes a detected voltage data and a detected current data and stores them in a memory 23. A detected voltage datum and a detected current datum at each point selected by the extract point selection means 25 can determine a line having V-I characteristic. An intersecting point at which a previously set reference current value crosses a line representing V-I characteristic is obtained in order to display an initial remaining capacity voltage in the display portion 31.

The initial remaining capacity calculation means 21 informs the extract point selection means 25 of the occurrence of an ignition on. The extract point selection means 25 extracts a detected voltage datum and a detected current datum from a plurality of detected voltage data which are stored in the memory 23. The detected voltage data and the detected current data are located from a point just before a voltage starts to decrease sharply after ignition on to a point near where the minimum voltage appears. Next, the extract point decision means 25 informs the initial remaining capacity calculation means 21.

The approximate line calculation means 27 takes a plurality of detected voltage data and detected current data for every predetermined time and stores them together with ignition on. The approximate line calculation means 27 discriminates a relationship between the detected voltage data and the detected current data. When a strong relationship (for example, -0, 9) is shown (that is, when a load starts running continuously), which is considered as running (including a start of continuous running), the approximate line calculation means 27 obtains an approximate linear function by using a method of least squares.

When an approximate linear function is found, a capacity calculation means 29 finds an intersecting point at which a previously set reference current value crosses an approximate linear function in order to display a remaining capacity voltage. The display portion 31 displays the remaining capacity according to the ratio of an open circuit voltage on charging to the remaining capacity voltage.

The power source supply control portion 33 provides a power source for the remaining capacity operation portion 19 only during a predetermined period at a predetermined time (when a voltage is applied to an open circuit voltage) after ignition off. Even if an ignition is on just after ignition off, it is possible to display a remaining capacity voltage just before ignition off.

Figure 4:
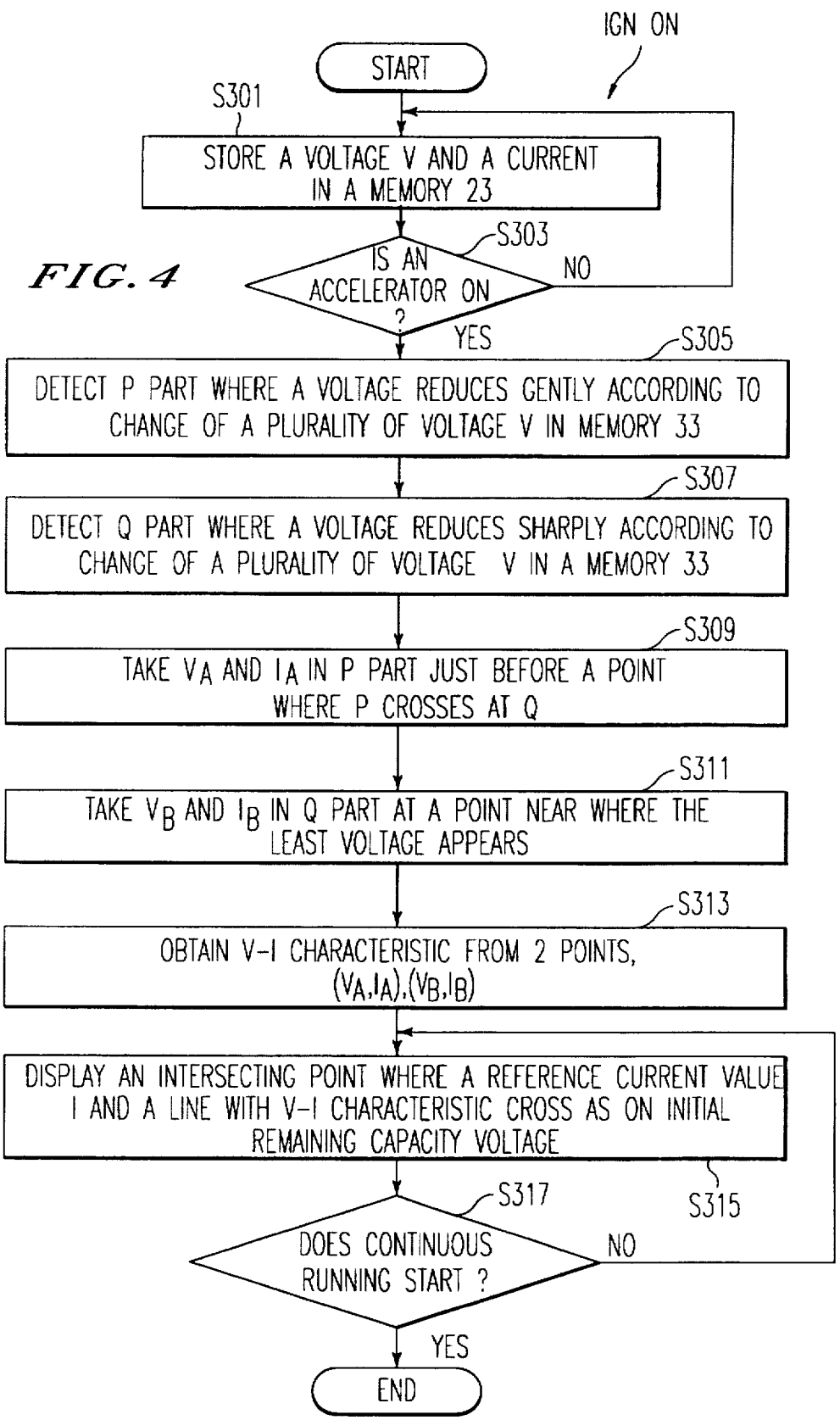
FIG. 4 is a flow chart showing an operation of an initial remaining capacity calculation means and an extract point decision means.

As described above, the battery remaining capacity measuring apparatus is explained below. FIG. 4 is a flow chart showing an operation of an initial remaining capacity calculation means and an extract point decision means. For simplicity, the embodiment is explained by a point just after a voltage starts to reduce sharply (as referred to a first point below) and a point near where a minimum voltage appears (as referred to a second point below).

A driver turns an accelerator off immediately after having the accelerator on in order to obtain a remaining capacity just after charging of the battery according to the invention. An accelerator on means that an accelerator is pushed and a motor starts to rotate.

For example, when a driver turns an ignition on after charging, an initial remaining capacity calculation means 21 in a remaining capacity operation portion 19 stores a detected voltage data and a detected current data which a current sensor 7 and a voltage sensor 9 detect in a memory 23 (S301). At the same time, the initial remaining capacity calculation means 21 discriminates whether an accelerator is on or not according to a change of these data (S303). Next, when an accelerator is determined as accelerator on, a storage of a detected voltage data and a detected current data in a memory 23 stops and an extract point selection means 25 starts.

Figure 5:
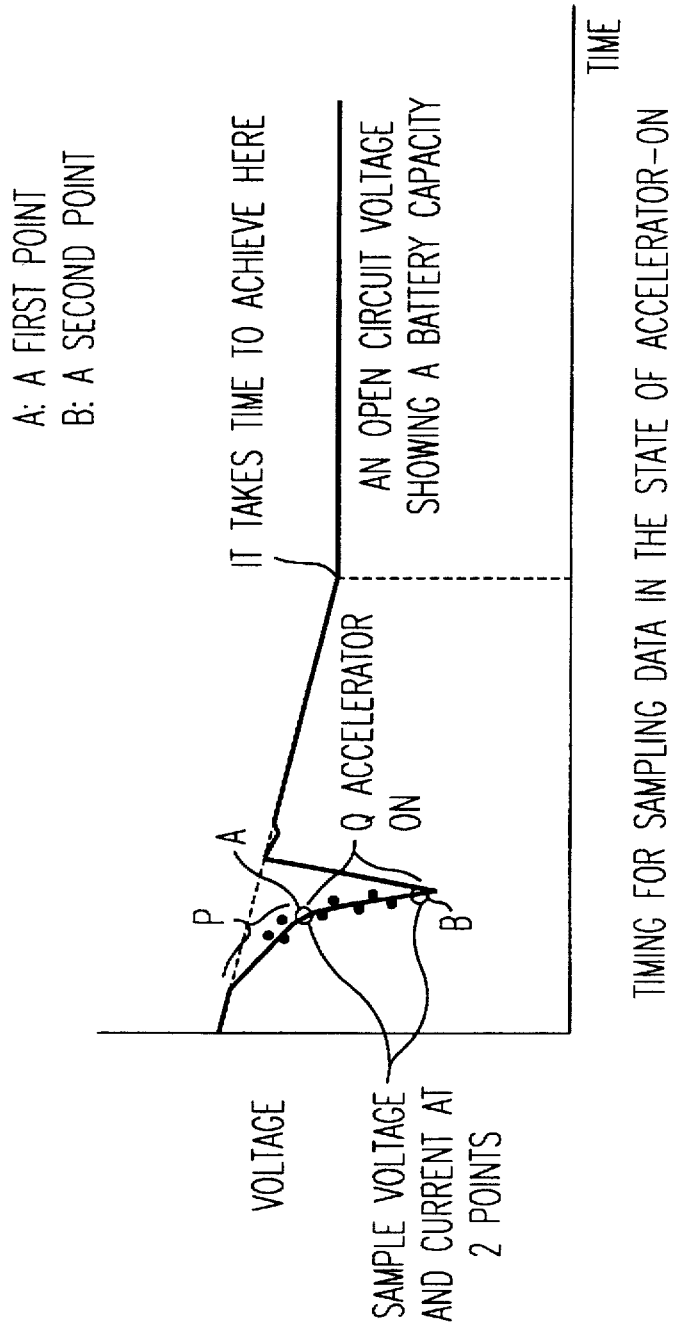

The extract point decision means 25 detects part P where a voltage reduces gently according to a change of a plurality of detected voltage data in a memory 33 as shown in FIG. 5 (S305). Next, the extract point selection means 25 , as shown FIG. 5, detects part Q where a voltage reduces sharply according to a change of a plurality of detected voltage data in a memory 33 (S307).

The extract point selection means 25 takes a detected voltage data VA and a detected current data IA (S309). A detected voltage data VA is at a first point, where part P in which a voltage reduces gently meets part Q in which a voltage reduces sharply. A detected current data IA corresponds to the detected voltage data VA.

Next, the extract point selection means 25 takes a detected voltage data VB and a detected current data IB (S311). A detected voltage data VB is at a second point which is included in Q point where a voltage reduces sharply. A detected current data IB corresponds to the detected voltage data VB.

Figure 6:
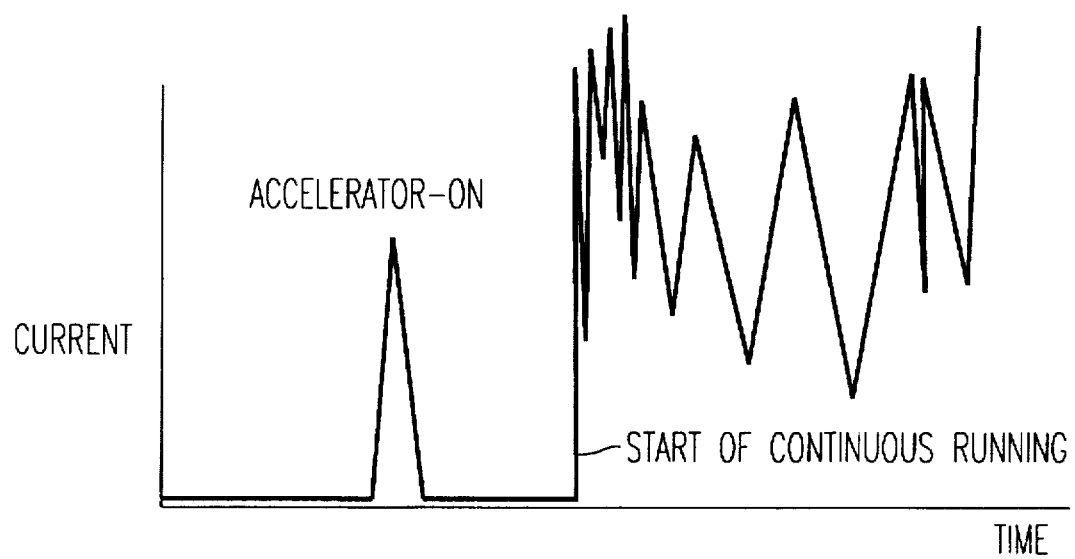

When a detected voltage data VA, a detected current data IA, a detected voltage data VB and a detected current data IB are taken, a voltage changes, for example, according to accelerator on, as shown in FIG. 5, and a current also changes as shown in FIG. 6. Thus, when an accelerator is on, a detected voltage data is related with a detected current data. That is, without discrimination of whether they are related each other or not, it is possible to extract a point which they are almost related by extracting these 2 points.

As shown in FIG. 7, on a coordinate system with a voltage axis and a current axis, for example, on a detected voltage data and a detected current data just after charging, (a detected voltage data VA, a detected current data IA) and (a detected voltage data VB, a detected current data IB) are plotted. In this case, since a detected voltage data just after charging (high voltage) is not related with a current, it is not possible to obtain a straight line. However, by using these 2 points , that is, (a detected voltage data VA, a detected current data IA) and (a detected voltage data VB, a detected current data IB), it is possible to obtain a straight line having V-I characteristic (Y=aX+b).

With these 2 points, (a detected voltage data VA, a detected current data IA) and (a detected voltage data VB, a detected current data IB), it is possible to obtain a straight line having V-I characteristic by using a method of least squares (S313). It is possible to obtain an intersecting point where a previously set reference current I and V-I characteristic cross so that an initial remaining capacity voltage can be obtained (S315).

This reference current I is the same value as the reference current value when a remaining capacity calculation means 29 obtains a remaining capacity voltage from an approximate linear function.

Next, S317 discriminates continuous running starts or not. When continuous running does not start, a remaining capacity which is obtained in S315 is displayed.

This discrimination of continuous running start is operated as follows. An approximate line calculation means 27 samples a predetermined number of voltage and current for every predetermined period, and detects a continuous running start when these data are much related one another (−0, 9).

That is, according to the invention, it is possible to obtain a detected voltage data as shown in FIG. 5 by turning an accelerator on after ignition on and immediately turning the accelerator off. 2 points are extracted, that is, one is a first point where a voltage reduces sharply and another is a second point near where the minimum voltage appears. An initial remaining capacity voltage can be obtained.

Accordingly, when obtaining an open circuit voltage just after ignition on, for example, when a driver turns an accelerator off just after making an accelerator on, it takes from a few minutes to about 10 minutes so that a voltage is applied to an open circuit voltage as shown in FIG. 5. However, when turning the accelerator on just after ignition on and then turning the accelerator off, 2 points are extracted, that is, one point is a first point just before where a voltage reduces sharply and another point is a second point near where a voltage is minimum. As a result, it is possible to obtain a correct initial remaining capacity for a short time.

As described above, running starts when a voltage has an increased dependence on current. Preferably, it can be determined to start continuously running when a car starts to run at a speed of more than 5 km/H.

What is claimed is:

1. A battery remaining capacity measuring apparatus comprising:

first means for collecting values of a plurality of voltages of a battery and values of a plurality of currents passing through a load during a first time period occurring before a start of continuous running of said load;

second means coupled to said first means for obtaining a line corresponding to said values of said plurality of voltages and said values of said plurality of currents, said line showing a relationship between voltage and current from a plurality of points within a range from a first point near where voltage begins to decrease sharply during said first time period to a second point near a minimum voltage occurring during said first time period;

third means coupled to said second means for finding an initial remaining capacity voltage at which a reference current value intersects said line: and fourth means coupled to said third means for displaying said initial remaining capacity voltage.

2. A battery remaining capacity measuring apparatus of claim 1, further comprising:

approximate line calculation means for sampling a plurality of continuous running detection points, each of said continuous running detection points corresponding to a voltage of said battery and a current passing through said load at a selected one of a plurality of predetermined times within a second time period during which said load starts running continuously, determining a relationship between voltage and current of said plurality of continuous running detection points, detecting a start of continuous running of said load if said relationship between voltage and current of said plurality of continuous running detection points indicates an increased dependence of voltage on current, and then obtaining an approximate line according to voltages and currents of said plurality of continuous running detection points; and remaining capacity calculation means for displaying a remaining capacity voltage of said battery which is obtained according to said approximate line and a reference value.

* * * * *

UNITED STATES PATENT AND TRADEMARK OFFICE
CERTIFICATE OF CORRECTION

PATENT NO.     : 5,798,646
DATED          : August 25, 1998
INVENTOR(S)    : Youichi Arai It is certified that error appears in the above-identified patent and that said Letters Patent is hereby corrected as shown below:

<u>Title page,</u>
Item [57], ABSTRACT,
Line 2, delete "3".
Line 3, delete "3".
Line 6, change "2" to -- two --.

Signed and Sealed this

Eighteenth Day of March, 2003

JAMES E. ROGAN
*Director of the United States Patent and Trademark Office*